United States Patent
Ogawa et al.

[11] Patent Number: 5,866,477
[45] Date of Patent: *Feb. 2, 1999

[54] METHOD OF POLISHING A CHAMFERED PORTION OF A SEMICONDUCTOR SILICON SUBSTRATE

[75] Inventors: Yoshihiro Ogawa; Hiromi Wakabayashi, both of Omura; Kunimi Yoshimura, Chigasaki, all of Japan

[73] Assignee: Komatsu Electric Metals Co., Ltd., Hiratsuka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 627,012

[22] Filed: Apr. 3, 1996

[51] Int. Cl.$^6$ .................................................. H01L 21/4763
[52] U.S. Cl. ........................... 438/626; 438/633; 438/691
[58] Field of Search .................................... 437/225, 228; 438/626, 638, 633, 691

[56] References Cited

U.S. PATENT DOCUMENTS

| | | | |
|---|---|---|---|
| 5,226,930 | 7/1993 | Sasaki | 51/308 |
| 5,476,413 | 12/1995 | Hasegawa et al. | 451/168 |
| 5,527,215 | 6/1996 | Rubino et al. | 451/527 |

*Primary Examiner*—Charles Bowers
*Assistant Examiner*—Reneé R. Berry
*Attorney, Agent, or Firm*—Varndell Legal Group

[57] ABSTRACT

The present invention is intended to provide a polishing method for a chamfered portion of a semiconductor silicon substrate, wherein edge relief of an oxidized silicon layer and/or an extrinsic gettering layer, and mirror polishing of chamfered portion can be performed at the same time for the semiconductor silicon substrate having the oxidized silicon layer and/or extrinsic gettering layer on the bottom thereof. The semiconductor silicon substrate is tilted at a designated chamfered angle θ with respect to an axis of a buff being mounted in a polishing apparatus to mirror polish the chamfered portion on one side. Then, the semiconductor silicon substrate is reversed, and the mirror polish is performed for the chamfered portion on the other side. A mean diameter of the colloidal silica constituting the polish liquid is 50~150 nm, the pH value of the polish liquid is 10~11, a specific gravity at 20° C. is 1~1.5, and a concentration is 30~50 wt %. The increase of mean diameter and grain number of the colloidal silica constituting the polish liquid being provided to the polishing portion, makes the polishing way be called as mechanical polishing preferable to chemical polishing. Hence, the edge removing of the oxidized silicon layer which was considered difficult to accomplish in the past is now easy to accomplish. A groove with a shape corresponding to the shape of the chamfered portion of the substrate can be formed on the circumference of the buff. The substrate is pushed into the groove so that polishing of both sides can be performed at the same time.

8 Claims, 3 Drawing Sheets

FIG. 6(a)
FIG. 6(b)
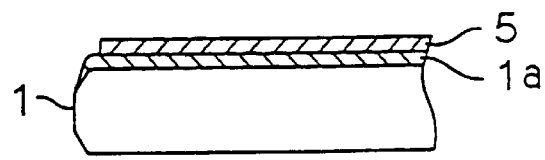
FIG. 6(c)
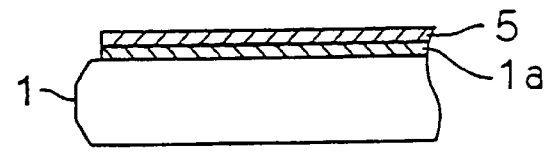
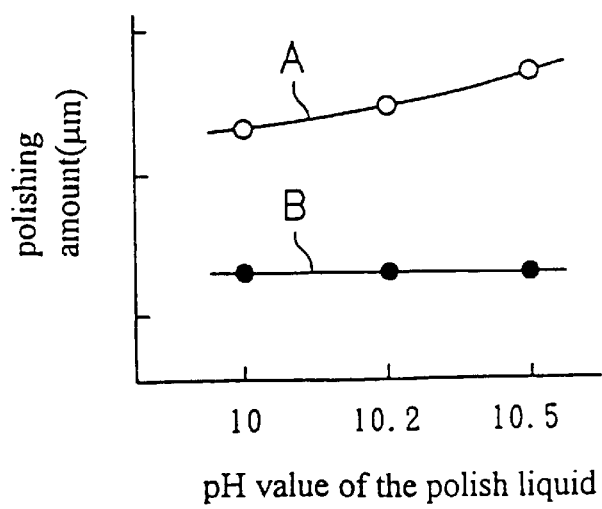
FIG. 7

METHOD OF POLISHING A CHAMFERED PORTION OF A SEMICONDUCTOR SILICON SUBSTRATE

BACKGROUND OF THE INVENTION

1. Field of The Invention

The present invention relates to a method of polishing the chamfered portion of a semiconductor silicon substrate.

2. Description of Prior Art

When a thin film is formed on the surface of a semiconductor silicon substrate by epitaxial growth, before carrying out the epitaxial growth procedure, an oxidized silicon layer 1a is formed on the bottom surface of the above silicon substrate 1 by a method such as atmosphere CVD and so on, as shown in FIG. 6(a), to prevent the auto-doping of re-diffusing impurities within the substrate into the above growing layer. The oxidized silicon layer 1a covers not only a flat portion of the bottom surface of the semiconductor silicon substrate but also the chamfered portion around its circumference. Nodules are generated in epitaxial growth while the oxidized silicon layer 1a is formed on the above chamfered portion. The nodule is an abnormal product of epitaxial growth due to the shape of circumferential portion and the surface grain of the semiconductor silicon substrate 1. The nodules cause particle defects while the device is being formed. Therefore, edge relief is necessary to remove the oxidized silicon layer covering on the above chamfered portion. Referring to FIG. 6(b), the edge relief should adhere a protecting tape 5, which is slightly smaller than the shape of the bottom surface of the semiconductor silicon substrate 1, to the oxidized silicon layer 1a of the semiconductor silicon substrate 1 to protect the oxidized silicon layer 1a and to expose the circumferential portion. Thereafter, as shown in FIG. 6(c) the semiconductor silicon substrate 1 is cleaned by etching liquid such as fluoroacid and so on to remove the circumferential portion of the oxidized silicon layer. Furthermore, when the extrinsic gettering polysilicon layer and the oxidized silicon layer are formed on the bottom surface of the semiconductor silicon substrate to remove the impurity, the polysilicon layer and the oxidized silicon layer on the circumferential portion of the semiconductor silicon substrate must also be removed. Next, the protecting tape 5 is detached, on the chamfered portion a mirror polish is performed, and the semiconductor silicon substrate is cleaned.

Recently, demand for the mirror polishing of the chamfered portion of a semiconductor silicon substrate has increased. However, for the semiconductor silicon substrate having an oxidized silicon layer formed on the bottom thereof, the edge relief and the mirror polishing of the chamfered portion after CVD have to be carried out separately. Thus, two kinds of apparatus are required, and the working procedures are increased. The protecting tape being attached on the semiconductor silicon substrate while in edge relief has to be littered, which increases costs. Moreover, the cleaning has to be performed twice due to the edge relief and the mirror polish Colloidal silica is used as polishing agent for lapping the chamfered portion of the semiconductor silicon substrate. However, it is difficult to remove the oxidized silicon layer formed on the semiconductor silicon substrate by colloidal silica. FIG. 7 illustrates the degree of polishing amount generated by carrying out the polishing of the oxidized silicon layer of the semiconductor silicon substrate ($SiO_2$ part) and the portion exclusive of the oxidized silicon layer (Si portion) with colloidal silicon during a certain period of time. The variation of polishing amount for the Si portion (A in the drawing) depends on the variation of polish liquid pH value which demonstrates an effect of the combination of the chemical polishing and mechanical polishing,however the polishing amount of the $SiO_2$ part (B in the drawing)is less than half that of the Si part, which is constant regardless of the pH variation. Accordingly, chemical polishing of the oxidized silicon layer cannot be expected to be effective, and polishing can only be achieved by the mechanical procedure. The oxidized silicon layer can be easily removed if SiC is used as abrasive grain, but the surface of the semiconductor silicon substrate roughs and a mirror polish cannot be obtained.

SUMMARY OF THE INVENTION

Thus, in order to address the prior art problems mentioned described above, the object of the present invention is to provide a polishing method for the chamfered portion of a semiconductor silicon substrate, wherein the method can perform edge relief of the oxidized silicon layer and/or the extrinsic gettering layer and mirror polish of the chamfered portion at the same time during one working process for a semiconductor silicon substrate having the oxidized silicon layer and/or extrinsic gettering layer on the bottom thereof.

To achieve the above object, the present invention involves a polishing method for the chamfered portion of semiconductor silicon substrate. When mirror polishing the chamfered portion around the circumference of the semiconductor silicon substrate having a oxidized silicon layer and/or the extrinsic gettering layer, the semiconductor silicon substrate and the buff are rotated, the circumferential portion of the semiconductor silicon substrate is pushed to the buff, and polish liquid having colloidal silica is applied to the polishing portion to mirror polish the chamfered portion. In such a configuration, it is characterized in that the mean diameter of the colloidal silica constituting polish liquid is 50~150 nm, the pH value of the polish liquid is 10~11, the specific gravity at 20° C. is 1~1.5, and the concentration is 30~50 wt %.

Preferably when performing the mirror polishing against the chamfered portion, the semiconductor silicon substrate is tilted at a predetermined chamfered angle θ of less than 90° with respect to the axis of the buff being mounted in a polishing apparatus to mirror polish the chamfered portion on one side. Then, reversing the semiconductor silicon substrate, a mirror polish is performed on the other side of the chamfered portion.

Preferably when performing the mirror polishing against the chamfered portion,the circumference of the rotating buff mounted in the polishing apparatus can be formed with a "V" shaped or "U" shaped groove. The chamfered portion of the semiconductor silicon substrate is pushed into the groove of the buff, so that the mirror polishing of the chamfered portions on the both sides can be accomplished simultaneously.

Preferably when performing the mirror polishing against the chamfered portion, the circumference of the rotating buff mounted in the polishing apparatus can be formed with a "V" shaped or "U" shaped groove, and a larger "V" shaped or "U" shaped opening can be formed on the circumference connected to the groove. Polish liquid can be provided to the "V" shaped or "U" shaped groove from the opening to mirror polish the chamfered portion of the semiconductor silicon substrate.

According to the structure described above, while the chamfered portion of the semiconductor silicon substrate having an oxidized silicon layer and/or an extrinsic gettering layer is pushed forward against the buff for mirror polish, since the mean diameter of the colloidal silica being included in the polish liquid applied for provided for the polishing portion is larger than that of conventional ones prior art, and the grain number is also increased, the polish liquid is substantially more effective in mechanical polishing and facilitating removal of the oxidized silicon layer, which has been difficult with use of the conventional polish liquid of chemical polishing plus mechanical polishing. Meanwhile, the edge relief of the oxidized silicon layer and/or the extrinsic gettering layer and the mirror polish of the chamfered portion can be accomplished at the same time.

The following detailed description, given by way of example and not intended to limit the invention solely to the embodiments described herein, will best be understood in conjunction with the accompanying drawings.

BRIEF DESCRIPTION OF THE DRAWINGS

FIGS. 6(a) to 6(c) are diagrams illustrating the conventional procedures of edge relief, in which FIG. 6(a) shows the semiconductor silicon substrate having an oxidized silicon layer formed on the bottom thereof, FIG. 6(b) shows the status of the oxidized silicon layer being attached with protecting tape, and FIG. 6(c) shows a status after being cleaned by fluoroacid; and FIG. 7 is a diagram illustrating a comparison result of polishing amounts during a certain period of time for the portion of the oxidized silicon layer and without the portion other than the oxidized silicon layer of the semiconductor silicon substrate.

DETAILED DESCRIPTION OF THE PREFERRED EMBODIMENTS

Figure 1:
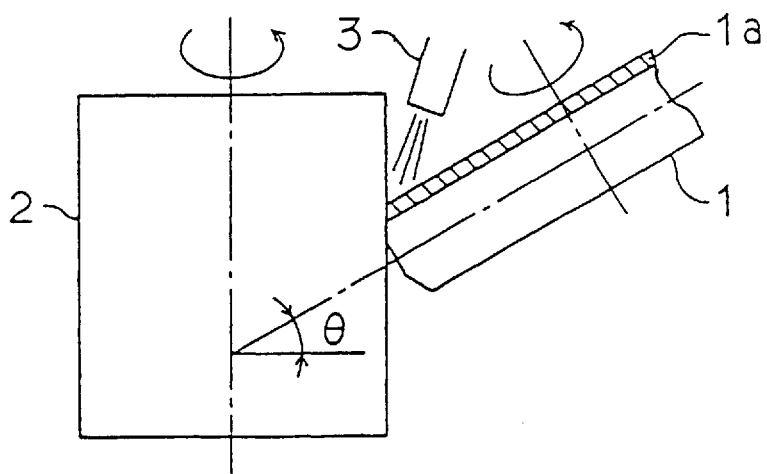
FIG. 1 is a diagram illustrating a first embodiment of a polishing method for a chamfered portion of a semiconductor silicon substrate according to the present invention.

Here, the embodiment of the polishing method for the chamfered portion of a semiconductor silicon substrate according to the present invention is described in accompaniment with the drawings. FIG. 1 is a diagram illustrating a first embodiment of a polishing method for the chamfered portion of a semiconductor silicon substrate according to the present invention. The bottom of the semiconductor silicon substrate 1 is formed with an oxidized silicon ($SiO_2$) layer 1a by CVD processing. The semiconductor silicon substrate 1 is mounted at a tilted angle θ in the mirror polishing machine and rotated. The tilted angle θ is a specified angle as a the chamfered angle of the semiconductor silicon substrate. A cylindrical buff 2 being mounted in the mirror polishing machine is rotated with its axis being vertical. The semiconductor silicon substrate 1 and the buff 2 are relatively rotated, and the semiconductor silicon substrate 1 is pushed against the buff 2. A reference number 3 indicates a nozzle for providing polish liquid. The edge relief of the oxidized silicon layer and the mirror polish of the chamfered portion can be accomplished at the same time by conducting the polish liquid including colloidal silica to the contact of the semiconductor silicon substrate 1 and the buff 2 via the nozzle 3. After completing the edge relief and the mirror polish, the semiconductor silicon substrate 1 is inverted for mirror polishing of the chamfered portion thereof on the opposite side. Finally, the semiconductor silicon substrate is cleaned to remove the colloidal silica.

Conventionally, it has been considered that it was hard to remove the oxidized silicon layer with colloidal silica. However, the present invention, as shown in Table 1, enlarges the mean diameter of the abrasive grain from 30 nm to 50~150 nm, raises the concentration of the abrasive grain to 30~50 wt %, and puts emphasis on the mechanical polishing than the chemical polishing, so that the conventional problems are alleviated.

TABLE 1

| abrasive grain | colloidal silica |
| --- | --- |
| pH | 10~11 |
| meandiamate of the grain (nm) | 50~150 |
| gravity (at 20° C.) | 1~1.5 |
| concentration (wt %) | 30~50 |

Figure 2:
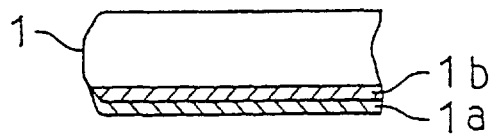
FIG. 2 is a partially cross-sectional diagram illustrating a three-layer structure of a semiconductor silicon substrate having an extrinsic gettering layer and a oxidized silicon layer.

The oxidized silicon layer can be properly polished even if the diameter of the abrasive grain is enlarged. With the semiconductor silicon substrate in which the edge relief of the oxidized silicon layer and the mirror polish of the chamfered portion were performed at the same time with the use of the polish liquid of this embodiment,generation of nodules were not found during epitaxial growth. And, as shown in FIG. 2, even though the semiconductor silicon substrate has a three-layer structure with the extrinsic gettering layer 1b and the oxidized silicon layer 1a on the bottom thereof, the edge relief of the two layers mentioned above and the mirror polish of the chamfered portion can also be accomplished without any problem.

Figure 3:
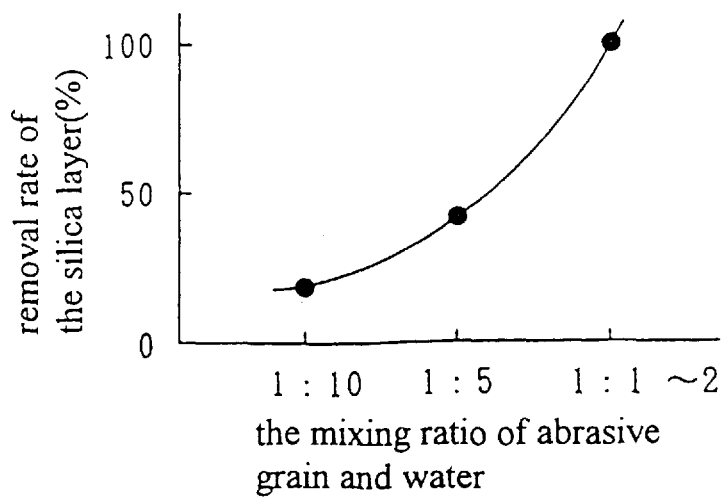
FIG. 3 is a diagram illustrating a relation between a mixing ratio of abrasive grain and water constituting the polish liquid and a removing ratio of the oxidized silicon layer.

FIG. 3 is a diagram of the removal rate of the oxidized silicon layer after a 2-minute polishing while the mixing ratios of the abrasive grain (colloidal silica) and water constituting the polish liquid are 1:10, 1:5, 1:1~2, respectively. When the mixing ratio is 1:1~2, that is, the concentration of the abrasive grain is 30~50 wt %, the oxidized silicon layer can be completely removed in two minutes.

Figure 4:
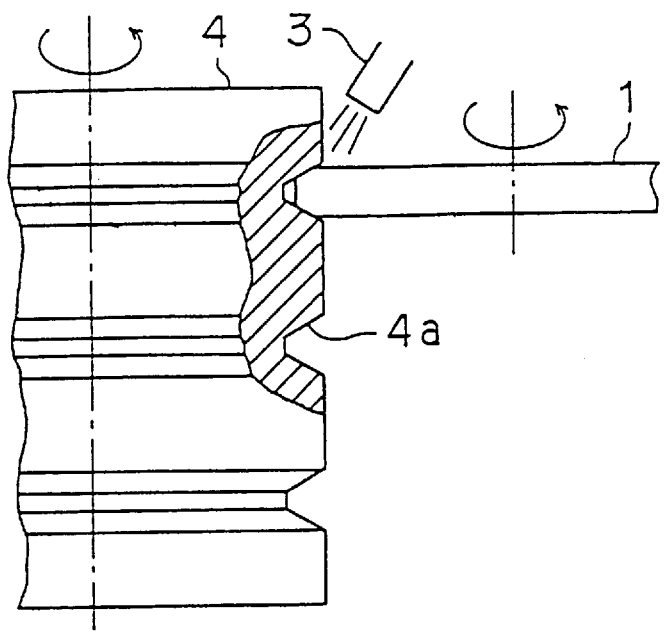
FIG. 4 is a diagram illustrating a second embodiment of the polishing method for the chamfered portion of the semiconductor silicon substrate according to the present invention.

FIG. 4 is a diagram illustrating a second embodiment of a polishing method for the chamfered portion of the semiconductor silicon substrate having an oxidized silicon layer on the bottom thereof. A "V" shaped groove 4a corresponding to the shape of the chamfered portion of the semiconductor silicon substrate 1 is formed on the circumference of the cylindrical buff 4. The buff 4 is harder than the buff employed in the first embodiment. While the buff 4 and the semiconductor silicon substrate 1 are rotated with respect to each other, the circumference of the semiconductor silicon substrate 1 is pushed into the groove 4a, so that the mirror polish of the chamfered portion and the edge relief of the oxidized silicon layer on both sides of the semiconductor silicon substrate can be accomplished at the same time. The polish liquid being used is as listed in the Table 1 and is provided from the nozzle 3 mounted near the circumference of the buff 4.

Figure 5:
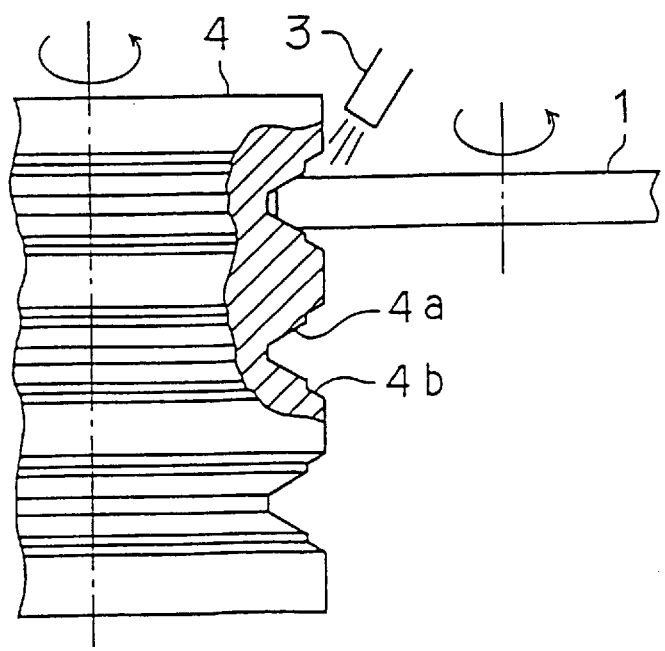
FIG. 5 is a diagram illustrating a third embodiment of the polishing method for the chamfered portion of the semiconductor silicon substrate according to the present invention.

FIG. 5 is a diagram illustrating a third embodiment of a polishing method for the chamfered portion of the semiconductor silicon substrate having an oxidized silicon layer on the bottom thereof. A "V" shaped groove 4a corresponding to the shape of the chamfered portion of the semiconductor silicon substrate 1 is formed on the circumference of the cylindrical buff 4, and a "V" shaped or "U" shaped groove 4b connecting with the groove 4a is formed on the circumferential opening of the buff 4. The polish liquid provided by the nozzle 3 mounted nearby the circumference of the buff 4 is listed in Table 1, and flows into the groove 4a via the groove 4b. And, in the second embodiment (referring to FIG. 4) and the third embodiment (referring to FIG. 5), if the semiconductor silicon substrate 1 being rotated repeatedly moves to and from in a horizontal direction periodically, then the application of polish liquid to the chamfered portion of the semiconductor silicon substrate becomes much smoother.

For the semiconductor silicon substrate in which the chamfered portion is mirror polished as in the first through third embodiments, a 6-μm thickness of epitaxial growth is performed thereon. No substrate has any nodules generated therein, therefore, the edge relief achieved according to the present invention is the same as that of the prior art. Performing the polishing by the embodiments of the present invention, compared with the prior-art edge relief, prevents auto-doping during epitaxial growing, since the oxidized silicon layer completely covers the chamfered portion of the semiconductor silicon substrate.

As described above, according to the present invention, while performing the mirror polish on the chamfered portion around the circumference of the semiconductor silicon substrate having an oxidized silicon layer and/or an extrinsic gettering layer, it is only necessary to push the semiconductor silicon substrate against the buff at a designated chamfered angle with respect to the circumference of the buff, or to provide a "V" shaped or "U" shaped groove corresponding to a designated shape of the chamfered portion on the buff and to push the semiconductor silicon substrate into the groove, thereby the edge relief of the oxidized silicon layer and/or the extrinsic gettering layer and the mirror polish of the chamfered portion can be accomplished simultaneously. Meanwhile, due to the increase of mean diameter and grain number of the colloidal silica constituting the polish liquid being provided to the polishing portion, the polishing way is preferable to be called as mechanical polishing than chemical polishing. Hence, the edge relief of the oxidized silicon layer by colloidal silica, which was considered difficult to accomplish in the past, is now feasible. And the edge relief described above can be accomplished in one process at the same time as the mirror polish of the chamfered portion. Accordingly, the performance of mirror polishing the chamfered portion of the semiconductor silicon substrate is improved, and also the initial cost is reduced.

What is claimed is:

1. A method of polishing a chamfered portion of a semiconductor silicon substrate, comprising:

pushing a buff against the chamfered portion of the semiconductor silicon substrate having an oxidized silicon layer and/or extrinsic gettering layer formed thereon;

supplying a polishing liquid containing colloidal silica to the chamfered portion; and polishing the chamfered portion by rotating the chamfered portion against the buff at a designated chamfered angle θ of less than 90° for removing the oxidized silicon layer and/or extrinsic gettering layer and for mirror polishing the chamfered portion.

2. A method of removing an oxide layer formed at a chamfered portion of a semiconductor silicon substrate, comprising steps of:

contacting the oxide layer formed on at the chamfered portion with a buff under pressure to form a contact portion;

supplying the contact portion with a polishing liquid containing colloidal silica;

removing the oxide layer from the chamfered portion by action of the polishing liquid and rotating the semiconductor silicon substrate in a state where the buff and the oxide layer are in contact; and contacting the chamfered portion with a buff under pressure and subsequently polishing the chamfered portion by the action of the polishing liquid and rotating the semiconductor silicon substrate in a state where the buff and the chamfered portion are in contact.

3. A method of removing an oxide layer as claimed in claim 2, wherein the semiconductor silicon substrate has an extrinsic gettering layer formed at the chamfered portion under the oxide layer, and further comprising steps of:

contacting the extrinsic gettering layer with the buff under pressure after the step of removing the oxide layer; and removing the extrinsic gettering layer from the chamfered portion by the action of the polishing liquid and rotating the semiconductor silicon substrate in a state where the buff and the extrinsic gettering layer at the chamfered portion are in contact.

4. A method of removing an oxide layer as claimed in claim 2, wherein the colloidal silica contained in the polishing liquid has a mean diameter of 50–150 nm, and the polishing liquid has a pH value of 10–11, a specific gravity of 1–1.5 at 20° C., and a concentration of 30–50 wt %.

5. A method of removing an oxide layer as claimed in claim 2, wherein the semiconductor silicon substrate has another chamfered portion in a side opposite to a side where the first-mentioned chamfered portion is formed, the step of contacting the buff and the oxide layer contacts the oxide layer with the buff under pressure and at a chamfered angle θ of less than 90°, and further comprising steps of:

reversing the semiconductor silicon substrate so as to contact the another chamfered portion with the buff at the chamfered angle θ of less than 90°; and polishing the another chamfered portion by the action of the polishing liquid and rotating the semiconductor silicon substrate.

6. A method of removing an oxide layer as claimed in claim 2, wherein the semiconductor silicon substrate has another chamfered portion in a side opposite to a side where the first-mentioned chamfered portion is formed, the step of contacting the buff and the oxide layer contacts the oxide layer with the buff under pressure and at a chamfered angle θ, and further comprising steps of:

reversing the semiconductor silicon substrate so as to contact the another chamfered portion with the buff at the chamfered angle θ; and polishing the another chamfered portion by the action of the polishing liquid and rotating the semiconductor silicon substrate.

7. A method of removing an oxide layer formed at a first chamfered portion of a semiconductor silicon substrate, comprising the steps of:

forming a groove having two inner sides which constitute a "V" or "U" shaped cross-section on a circumference of a buff, the groove opening in a radial direction relative to the buff;

contacting one side of the groove and the oxide film under pressure to form a first contact portion;

contacting another side of the groove and a second chamfered portion under pressure to form a second contact portion;

supplying the first and second contact portions with a polishing liquid containing colloidal silica;

removing the oxide layer from the chamfered portion by action of the polishing liquid and rotating the semiconductor silicon substrate in a state where the first contact portion is formed; and polishing at the chamfered portion by said using the polishing liquid and by said rotating the semiconductor silicon substrate together with removing the oxide layer in a state where the second contact portion is formed.

8. A method of removing an oxide layer as claimed in claim 7, further comprising step of:

forming another groove which is larger than the groove and connected with the groove; and wherein the polishing liquid is supplied the another groove in the step of supplying the polishing liquid.

* * * * *